(12) United States Patent
Carr

(10) Patent No.: US 9,006,857 B1
(45) Date of Patent: Apr. 14, 2015

(54) PLATFORM COMPRISING AN INFRARED SENSOR

(71) Applicant: William N. Carr, Montclair, NJ (US)

(72) Inventor: William N. Carr, Montclair, NJ (US)

( * ) Notice: Subject to any disclaimer, the term of this patent is extended or adjusted under 35 U.S.C. 154(b) by 0 days.

(21) Appl. No.: 14/245,598

(22) Filed: Apr. 4, 2014

Related U.S. Application Data

(60) Provisional application No. 61/948,877, filed on Mar. 6, 2014, provisional application No. 61/808,461, filed on Apr. 4, 2013.

(51) Int. Cl.
*H01L 31/058* (2006.01)
*H01L 27/16* (2006.01)
*G01J 5/14* (2006.01)
*H01L 27/146* (2006.01)
*G01J 5/12* (2006.01)

(52) U.S. Cl.
CPC . *H01L 27/16* (2013.01); *G01J 5/14* (2013.01); *H01L 27/14601* (2013.01); *G01J 2005/123* (2013.01)

(58) Field of Classification Search
USPC ............ 374/130; 257/4, 12, 14, 40, 204, 209, 257/288, 292, 469, 470, 712, 735, 741; 438/22, 54, 99, 129, 141, 455, 478
See application file for complete search history.

(56) References Cited

U.S. PATENT DOCUMENTS 6,339,187 B1 * 1/2002 Inoue ............................ 136/225
2012/0269228 A1 * 10/2012 Nakamura et al. ............ 374/130

* cited by examiner

*Primary Examiner* — Kyoung Lee
*Assistant Examiner* — Ratisha Mehta
(74) *Attorney, Agent, or Firm* — Kaplan Breyer Schwarz & Ottesen, LLP

(57) ABSTRACT

An IR sensor includes a suspended micro-platform having a support layer and a device layer disposed thereon. IR absorbers are disposed in or on the device layer. IR radiation received by the IR absorbers heats an on-platform junction of each of a plurality of series-connected thermoelectric devices operating in a Seebeck mode, the devices producing a voltage indicative of the received IR. Other thermoelectric devices are used to cool the platform, and a pressure sensing arrangement is used to detect loss of vacuum or pressure leaks.

26 Claims, 12 Drawing Sheets

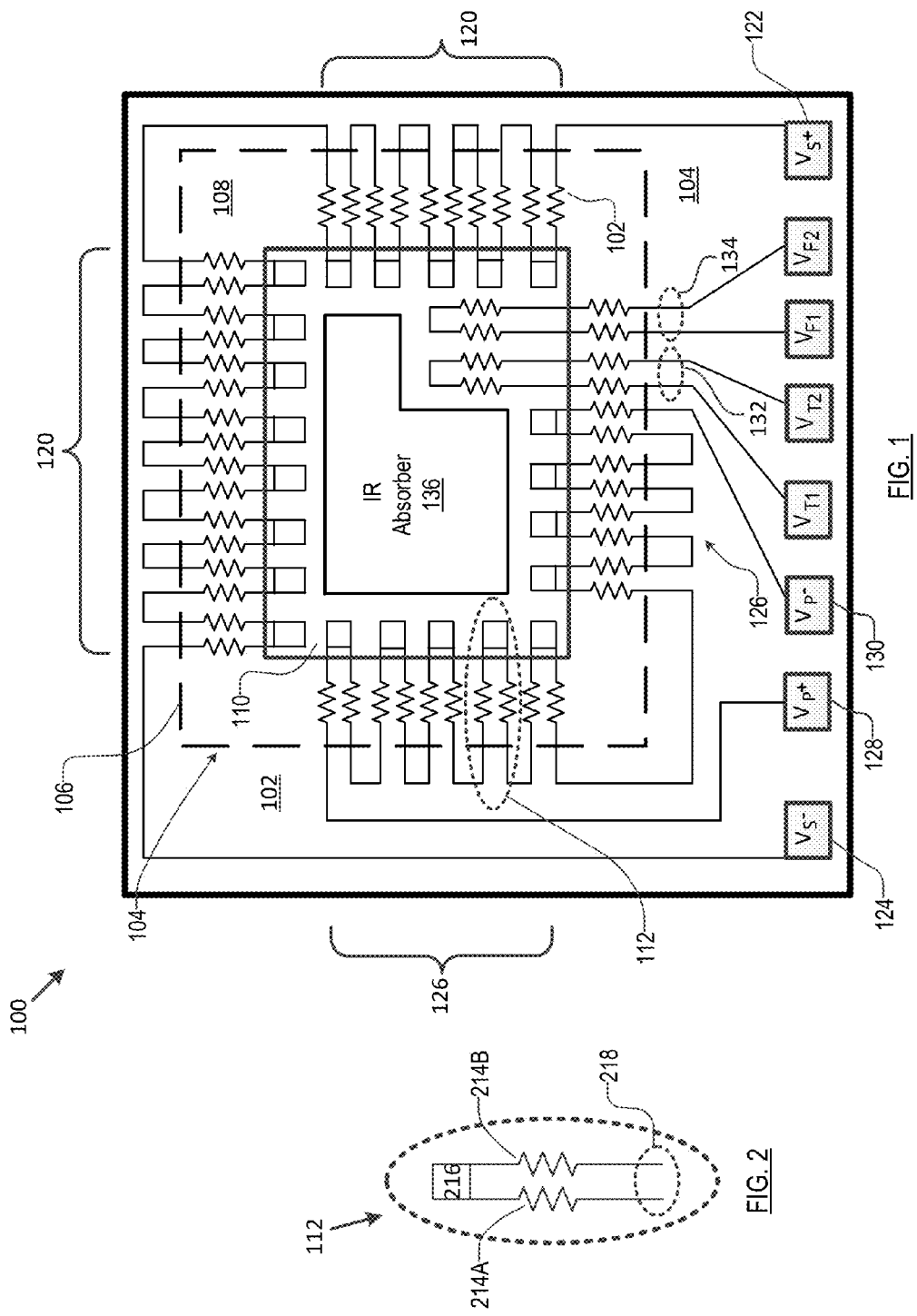

PLATFORM COMPRISING AN INFRARED SENSOR

STATEMENT OF RELATED CASES

This case claims priority to U.S. Provisional Patent Applications 61/808,461 filed Apr. 4, 2013 and 61/948,877 filed on Mar. 6, 2014, both of which cases are incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention pertains to a sensor platform.

BACKGROUND OF THE INVENTION

Many sensor applications require sophisticated thermal packages for providing heat dissipation and/or temperature control. This is due to the nature of current processors and/or sensor-specific considerations.

Historically, circuit-level, device-level, and system-level techniques have been employed to manage heat dissipation. Cooling techniques can be broadly classified as "passive" or "active" based on power consumption. For passive techniques, power consumption is zero and relies on conduction (heat sink) and/or natural convection. For active techniques, some type of external power is required. A variety of active cooling techniques are available; choice is typically dependent on the application. Active cooling techniques include fans/heat pipe (hybrid), thermoelectric, liquid cooling, direct immersion, refrigeration, and cryogenics.

SUMMARY OF THE INVENTION

The present invention provides an Infrared Radiation ("IR") sensor. The salient elements of the IR sensor include:
 a micro-platform (i.e., a platform having micron-sized dimensions);
 the micro-platform comprises a support layer and a device layer, wherein the device layer is disposed on a portion of the support layer;
 one or more structures, disposed in or on the device layer, which are adapted for absorbing IR radiation; and
 a plurality of thermoelectric structures having two junctions, wherein one junction of thermoelectric structure is positioned on the device layer and the other junction is positioned off-platform.

In operation, IR is absorbed by the IR absorbers disposed on the device layer of the micro-platform. The heat absorbed by the IR absorbers will be conducted to the one junction, on the device layer, of each thermoelectric structure, causing a temperature increase thereof. At least some of the thermoelectric structures are operating in a Seebeck thermovoltaic mode whereby they generate a voltage proportional to the temperature difference between the junction on the device layer and the junction that is off-platform at a reference temperature. Thus, the voltage generated is proportional to the IR power received. The generated voltage is further processed by a signal conditioning circuit to provide a final IR-sensor system output voltage. That final output voltage is used to determine IR power received in known fashion.

In some embodiments, the IR sensor is hermetically packaged. In the illustrative embodiment, the IR sensor includes a pressure-sensing arrangement for monitoring the leak status of the packaged IR sensor and absolute temperature sensing for closed-loop control, among any other functions.

The micro-platform of the IR sensor can be formed as follows. A micro-machinable material having, in some embodiments, a surface film of low thermal conductivity and low electrical conductivity cavity is prepared. In some embodiments, the material is prepared by oxidizing a silicon wafer. One or more cavities are then formed in one or more regions of the oxidized silicon wafer, leaving only the surface film above each cavity. Each such cavity thereby defines one overlying micro-platform, or, more precisely, the support layer thereof. Among any other purposes, this arrangement substantially thermally isolates the one or more micro-platforms from the surrounding ("off-platform") regions. The support layer, which in the illustrative embodiment is silicon dioxide, has a thickness that is typically in the range of about 0.1 to 5 microns.

In the illustrative embodiment, the device layer, which is disposed on the support layer, comprises a material having high thermal conductivity and high electrical conductivity. In some embodiments, the device layer comprises single crystal silicon. In some embodiments, the device layer is a collection of closely spaced discrete structures that are formed from/in the device layer and are disposed on the support layer (as opposed to being a layer of material residing on the support layer and on which devices are disposed).

One or more different types of structures that are physically adapted to absorb IR are disposed in or on an IR absorbing region of the device layer. One or more of the following structures can be used as IR absorbers in conjunction with the present invention:
 One or more antennas tuned to one or more different IR wavelengths. The use of an antenna as an IR absorber is particularly useful for applications involving very long wave IR (>12 microns wavelength in air).
 An infrared-absorbing film. The film comprises a silicate matrix or other dielectric matrix, which can be deposited via a sol-gel process. Nanometer-dimensioned particulates comprising "coin" metals (e.g., Ni, Au, Ag, Cu, etc.) are embedded in the film.
 A high density of structures such as holes, pedestals, or silicon "grass". This particularly enhances sensor response to IR in the mid to long wavelength range.

The thermoelectric devices provide several functions in conjunction with the illustrative embodiment of the invention. As already mentioned, some of the thermoelectric devices are operated as a sensor in a Seebeck thermovoltaic mode. In the context of the illustrative embodiment, such thermoelectric devices will generate a voltage proportional to the IR power absorbed. In this manner, the thermoelectric device "senses" the absorbed IR.

Some other of the thermoelectric devices are operated as Peltier coolers to cool the micro-platform. To do this, an electric current is passed in the appropriate direction through the junction causing both types of charge carriers to move away from the junction and convey heat away, thus cooling the junction. This is advantageous because cooling reduces the electrical thermal noise inherent in the output signal from the sensing thermoelectric devices.

Single thermoelectric devices, whether for cooling or sensing, will not provide an adequate response for embodiments of the invention. As a consequence, a plurality of series-connected thermoelectric devices are used in embodiments of the present invention. In the illustrative embodiment, one array of series-connected thermoelectric devices are used for sensing and another array is used for cooling.

In the illustrative embodiment, the thermoelectric devices are implemented via semiconductor materials, wherein the junction is formed between two different semiconducting materials, with or without a metallic ohmic link. In some embodiments, there is no ohmic metal interconnect between the doped semiconductor regions; rather, the interface of the two heavily doped regions provide a form of p-n junction.

In some embodiments, the IR sensor is hermetically packaged and placed under vacuum or pressurized with a low-thermal conductivity gas. These approaches help limit the thermal paths for cooling of the thermocouples. In some embodiments, the IR sensor includes a pressure-sensing arrangement, including a piezo-transducer that, in conjunction with reference data, can be used to detect hermetic seal failures or incremental gas leaks. Furthermore, some embodiments of the IR sensor include an absolute temperature sensor, such as a thermistor, to sense the temperature of the micro-platform and provide data for closed-loop control of that temperature via the Peltier coolers.

An important aspect of many embodiments of the present invention is that although the support layer of the micro-platform has low thermal conductivity, it must behave as if it were isothermal, or nearly so, for accurate sensing of received IR. In the illustrative embodiment, this is accomplished as follows:

The individual structures that form the device layer have high thermal conductivity and those structures are situated quite close to one another on the support layer; and
the sampling interval, $\tau_s$, for readout or excitation of the structures on the micro-platform must be less than thermal time constant, $\tau_p$, of the platform:

$$\tau_p = c/\sigma \quad [1]$$

wherein:
c is the thermal heat capacity of the platform; and
σ is the thermal conductance between the platform and substrate as required to maintain the isotherm over the platform.

The nano-wires (so-called because of their nano-scale dimensions) that electrically couple on-platform structures to off-platform structures, such as those that are part of the thermoelectric devices, present an interesting challenge. They must be electrically conductive yet, at the same time, they should exhibit low thermal conductivity to keep the amount of heat that they conduct on or off the platform to a practical minimum. This is difficult to achieve via materials selection; indeed, since they are fabricated from the device layer material, they typically comprise a material having both high electrical and thermal conductivity.

In accordance with some embodiments, the wires include a physical adaptation for reducing their ability to conduct heat. In the illustrative embodiment, the physical adaptation is a plurality of "scattering holes" to scatter phonons, thereby reducing thermal conductivity along the length of the wire. The spacing between the scattering holes on the wire is about the phonon scattering length and greater than the scattering length for electrical charge carriers (i.e., electrons or holes). In particular, in conjunction with embodiments of the IR sensor, the phonon scattering length (about 50 to 500 nanometers) is typically about 10× greater than the scattering length for electrical charge carriers (about 5 to 50 nanometers). The presence of these scattering holes results in an increase in the ratio of electrical conductivity to thermal conductivity of each wire.

To package the platform, the processed wafer is diced, using techniques which do not damage the thin platform area, as known to those skilled in the art. For example, dicing can be performed using a $CO_2$ or laser scriber tool. The resulting die are next bonded to the leadframe of an appropriate header, followed by ultrasonic wire bonding. A cap for the header is bonded with an appropriate metal or epoxy film to provide, in some cases, a hermetic seal around the platform structure.

BRIEF DESCRIPTION OF THE FIGURES

FIG. 1 depicts a plan view of an IR sensor comprising a micro-platform with heat/temperature control in accordance with the illustrative embodiment of the present invention.

FIG. 2 depicts a thermoelectric device used in the IR sensor of FIG. 1.

DETAILED DESCRIPTION

Definitions. The following terms as explicitly defined for use in this disclosure and the appended claims:

"micro-platform" means a platform having dimensions of about 100 nanometers on a side up to about 1 centimeter on a side and including one junction of at least one thermoelectric device.

"nano-dimensioned" or "nano-sized" or "nanometer-sized" means a structure whose largest dimension does not exceed 500 nanometers.

"nano-wire" means a portion of electrically conductive material having a thickness and width each with a maximum size of no more than about 500 nanometers and an arbitrarily long length. The lower "limit" on thickness and width is primarily a function of technology. Using, for example, nanotubes, the thickness and width (or diameter) could be about 10 nanometers or even smaller.

"thermocouple" means a thermoelectric device, used to measure temperature, consisting of two dissimilar metals or semiconductors. In some versions, the two conductors are joined at one end, creating a junction. The junction is where temperature is measured. When the junction experiences a change in temperature, a voltage is created. In some other versions, the conductors are joined at both ends, wherein one junction is at the temperature to be measured and the second junction is at a fixed temperature. When the two different metals are exposed to a temperature gradient, they generate an electrical charge.

"thermoelectric effect" means the direct conversion of a temperature difference to a voltage and vice-versa. This term encompasses three separate effects: the Seebeck effect, the Peltier effect, and the Thomson effect. The Seebeck effect is the conversion of temperature differences directly into electricity. The Peltier effect is the presence of heating or cooling at an electrified junction of two dissimilar conductors.

Figure 3:
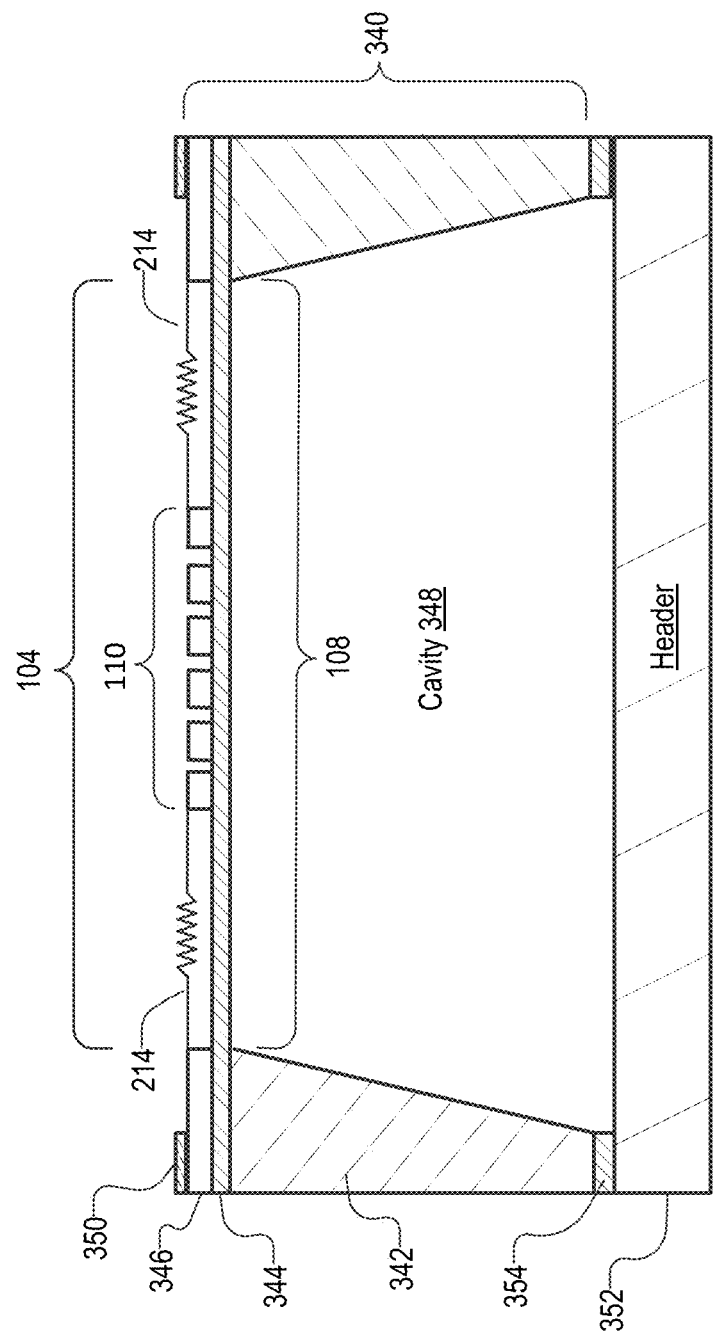
FIG. 3 depicts a simplified side cross-sectional view of FIG. 1.

FIGS. 1 and 3 depict respective plan and cross-sectional views of IR sensor 100 in accordance with the illustrative embodiment of the present invention. IR sensor 100 comprises off-platform region 102, micro-platform 104, thermoelectric devices 112, resistor 132 and piezo transducer 134. The micro-platform includes IR absorption-enhanced surfaces that increase the absorption of infrared radiation in selected wavelength ranges.

Referring to both FIGS. 1 and 3, micro-platform 104 comprises suspended support layer 108 and device layer 110. Support layer 108 is a suspended portion of layer 344, created by forming cavity 348 in bulk material 342. Perimeter 106 of cavity 348 defines the extent of support layer 108. Support layer 108, and layer 344 from which it is defined, comprise a material having relatively low thermal conductivity ($k<0.2$ W/(m·K)) and low electrical conductivity ($\sigma<0.001$ Siemens/m). Materials suitable for use as support layer 108 include, without limitation, many oxides (e.g., silicon dioxide [$SiO_2$], titanium dioxide [$TiO_2$], etc.), and silicon nitride [$Si_3N_4$]. Bulk material 342 can be, for example, silicon or other micro-machinable materials.

Off-platform region 102 is any region outside perimeter 106 of cavity 348. One junction of each thermoelectric device 112 is disposed on off-platform region 102. Because the off-platform region is substantially thermally isolated from micro-platform 104, the one junction of each thermoelectric device 112 disposed thereon can be maintained at a reference temperature. Additionally, electrical contact pads (e.g., contacts 122, 124, 128, 130, etc.) and portions of other devices (e.g., resistor 132 and piezo transducer 134, etc.) are disposed on off-platform region 102.

Device layer 110 is disposed on support layer 108. In some embodiments, device layer 110 comprises a material having high thermal conductivity and high electrical conductivity, including, without limitation, single crystal silicon, germanium, silicon-germanium, bismuth-telluride, graphine, and carbon nanotubes. Thermoelectric devices 112 are patterned from device layer 110.

As depicted in FIG. 3, substrate 342 is coupled to header 352. For clarity, a single micro-platform 104 is depicted; typically, more than one such platform is coupled to a header.

Figure 4:
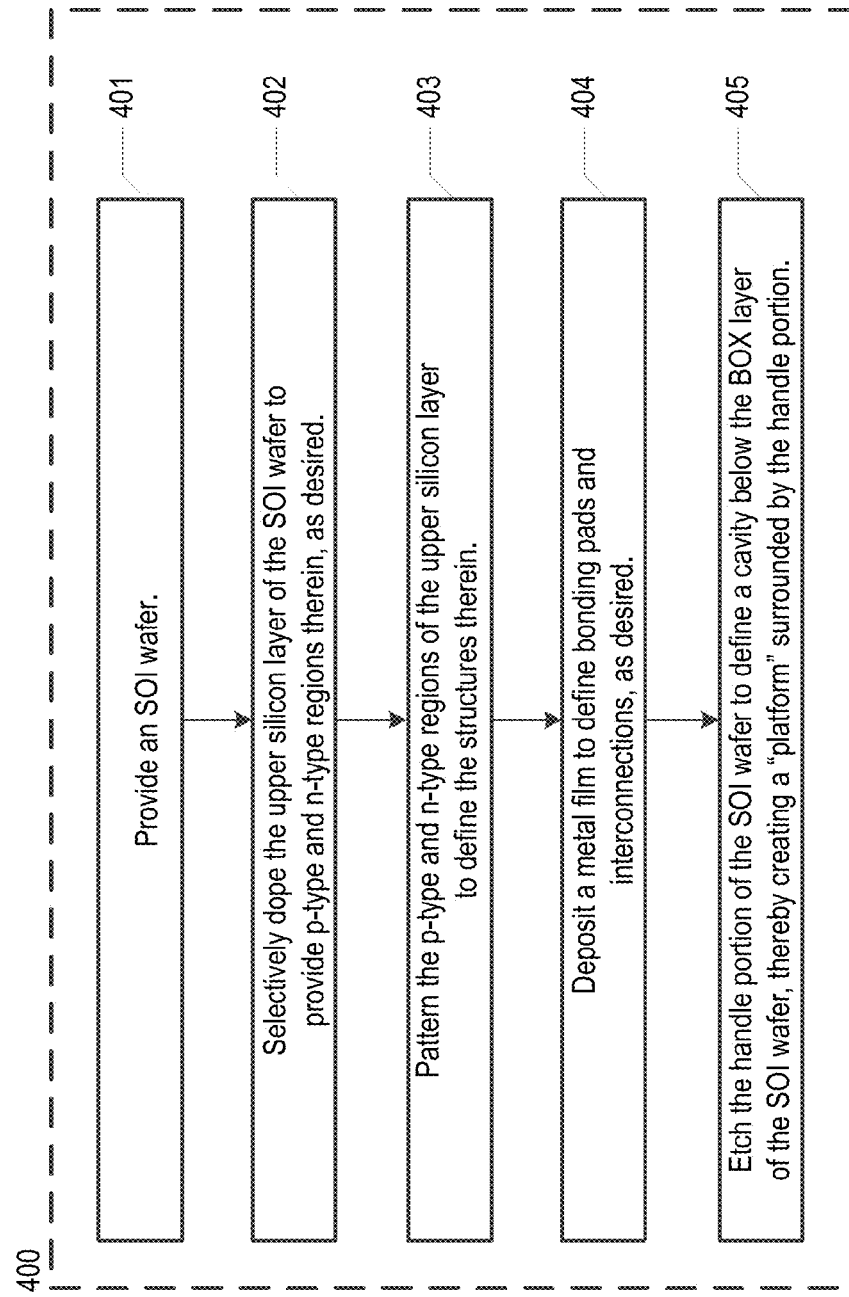
FIG. 4 depicts a method for fabricating the platform of FIG. 1 in accordance with an embodiment of the invention.

FIG. 4 depicts method 400 for forming micro-platform 104 of FIG. 1 in accordance with an illustrative embodiment of the invention. According to the method, a silicon-on-insulator ("SOI") wafer is provided at operation 401. Well known to those skilled in the art, an SOI wafer comprises three layers: (i) an uppermost layer of single crystal silicon, which is suitable for use as a device layer, (ii) a lowermost substrate or "handle" layer of single crystal silicon, and (iii) a layer of silicon dioxide sandwiched between the aforementioned layers. This buried oxide or "BOX layer forms the support layer for the platform. With reference to FIG. 3, the uppermost layer corresponds to layer 346 and device layer 110, the handle layer corresponds to layer 342, and the BOX layer corresponds to layer 344 and support layer 108. More generally, processing begins with a starting wafer of micro-machinable material, with a surface film of low thermal conductivity and low electrical conductivity, such as an oxidized silicon wafer.

If the starting wafer is other than SOI, such as an oxidized silicon wafer, then a layer of semiconductor is deposited on the oxide layer. The semiconductor layer serves as a device layer (i.e., layer 110). That layer will eventually be processed to create thermoelectric couples as well as other structures on the platform, depending on application specifics. For the creation of silicon-based structures on the platform, processing of the top surface can be performed in a semiconductor foundry cleanroom using processing generally compatible with production of silicon integrated circuits including CMOS If the starting wafer is an SOI wafer, depositing a layer of semiconductor is not required, since the upper surface of an SOI wafer is a semiconductor layer. In this case, processing continues at operation 402, wherein the upper layer of the SOI wafer is selectively doped to provide p-type and n-type regions therein, as required to support the intended design (i.e., the creation of on-platform structures and nanowires).

If the device layer in the starting wafer is already doped to a desired p- or n-doping level, then a compensating donor or acceptor impurity is used to achieve the desired impurity polarities and densities for the thermoelectric devices and other structures. Those skilled in the art are familiar with such doping operations, including appropriate dopant atoms, doping levels, and methods for doping.

In operation 403, the doped device layer is selectively patterned to define the desired structures, using, for example, standard lithographic patterning techniques. An extreme ultra-violet stepper, for example, can be used to define any nano-dimensioned structures, such as nano-wires 214.

In operation 404, a metal film (e.g., aluminum, etc.) is deposited, followed by conventional metal lift-off processing to define bond pads (i.e., pads 350) and interconnections on the "off-platform" portion 102.

In operation 405, a back-side etch is performed to create cavity 348 beneath the region designated to be micro-platform 104. The etch proceeds through substrate layer 342 to what will become support layer 108 of the micro-platform. In the case of an SOI starting wafer, the etch proceeds through the substrate to the silicon dioxide layer. This effectively "releases" micro-platform 104 and thermally isolates it from the surrounding material.

The back-side etch can be performed via deep-reactive ion etching ("DRIE"), configured, for example, to achieve near vertical sidewalls of the cavity (e.g., via the Bosch process, etc.). Alternatively, the backside etch can be performed using wet chemical etchants, such as, without limitation, TMAH, hydrazine, xenon hexafluoride, or potassium hydroxide.

Operations 401 through 405 produce the micro-platform, on-platform structures, and off-platform structures.

Referring now to FIG. 2, each thermoelectric device 112 includes two junctions: junction 216 is disposed on micro-platform 104 (in/on device layer 110) and junction 218 is disposed in/on off-platform region 102. The two junctions are joined by nano-wires 214A and 214B.

Junction 216 of thermoelectric devices 112 can be formed in device layer 110 via techniques known in the art, such as, for example, masked diffusion doping one species of impurity (n or p) into a corresponding (p-type or n-type) impurity or via separate masked diffusions of n and p impurities. In some embodiments, the p-type impurity is boron and the n-type impurity is arsenic, although other species of dopant may suitably be used. The thermoelectric devices 112 are heavily doped at degenerate levels in order to (a) reduce the series resistance of the "legs" of the thermoelectric devices within the temperature gradient and (b) reduce the temperature coefficient of the Seebeck coefficient and source resistance to a minimum.

Nano-wires 214A and 214B (collectively "214"), which connect junctions 216 and 218, are suspended over support layer 108 and can be formed, for example, by patterning layer 346 (e.g., single-crystal silicon) or separately deposited and patterned from non-silicon material of high electrical conductivity, such as, without limitation, germanium, silicon-germanium, bismuth-telluride, graphine, PZT and alloys thereof, and carbon nanotubes.

Electrical connections external to micro-platform 104 are patterned metal interconnects, typically aluminum. Thus, nano-wires 214 couples to such metal interconnects once in off-platform region 102 beyond perimeter 106 (see FIG. 1).

Referring again to FIG. 1, thermoelectric devices 112 are organized into two arrays: array 120 of "sensing" (Seebeck mode) thermoelectric devices and array 126 of "cooling" (Peltier mode) thermoelectric devices. As previously discussed, the sensing thermoelectric devices generate a voltage responsive to the temperature difference that results between junctions 218 and 216 as a consequence of heating due to received IR. The cooling thermoelectric devices are used to cool device layer 110 to reduce the electrical thermal noise inherent in the output signal from the sensing thermoelectric devices.

In the embodiment depicted in FIG. 1, the cooling devices (linear array 126) and the sensing devices (linear array 120) are implemented as distinct structures. In some other embodiments, a single linear array can be utilized for both cooling and sensing. This is accomplished by switching connections to external voltage sources and signal-conditioning preamp circuits.

Figure 5:
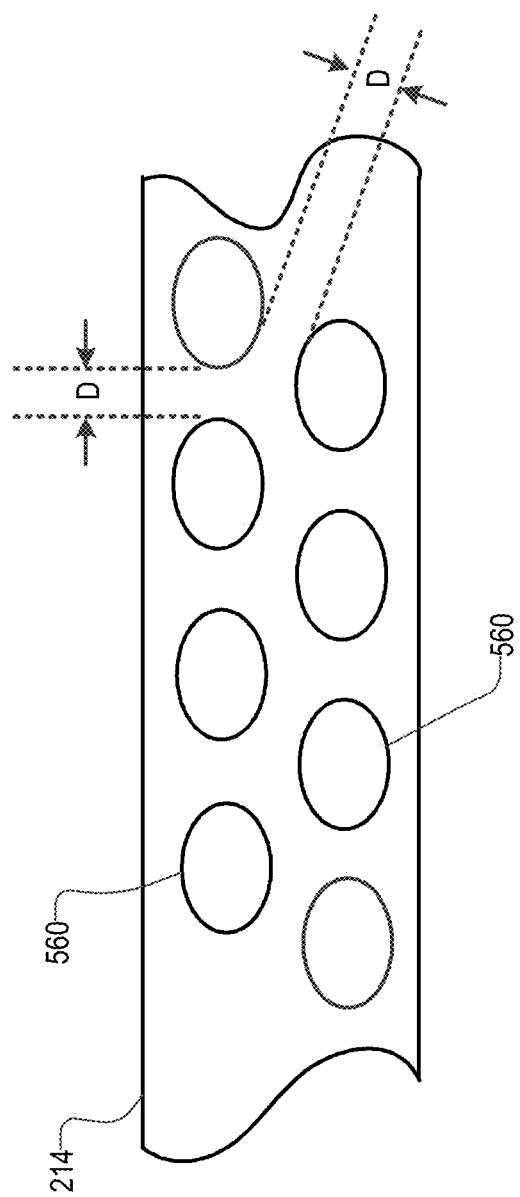
FIG. 5 depicts a nano-wire for providing electrical connection between on-platform structures and off-platform structures.

FIG. 5 depicts a portion of nanowire 214. Although nanowires 214 are formed from a material with relatively high thermal conductivity, it is important to minimize, to the extent possible, the amount of heat conducted to or away from micro-platform 104 via the nano-wires. The thermal conductivity of nano-wire 214 is a function of its dimensions, the thermal conductivity of the material of which the nano-wire is made, and the phonon scattering coefficient within the beams. The phonon scattering-efficiency coefficient is dependent on the phonon scattering from the silicon lattice and boundaries. The greater the scattering, the lower the thermal conductivity. This scattering is enhanced by including "holes"—phonon scattering holes—in the nano-wires. As a consequence, the presence of phonon scattering holes 560 reduces thermal conductivity along the length of nano-wire 214. The spacing, D, between the scattering holes is about equal to the phonon scattering length (about 50 to 500 nanometers). The diameter of the holes is less than about 300 nanometers. The presence of these scattering holes results in an increase in the ratio of electrical conductivity to thermal conductivity of each nano-wire.

To increase the sensitivity of IR detector 100, one or more IR absorbing structures, of the same or different type, are disposed in/on device layer 110 of micro-platform 104. By virtue of their structure or other properties thereof, IR absorbing structures increase the absorption of IR relative to what the same material, unstructured or otherwise unmodified, would be capable of absorbing.

Figure 6:
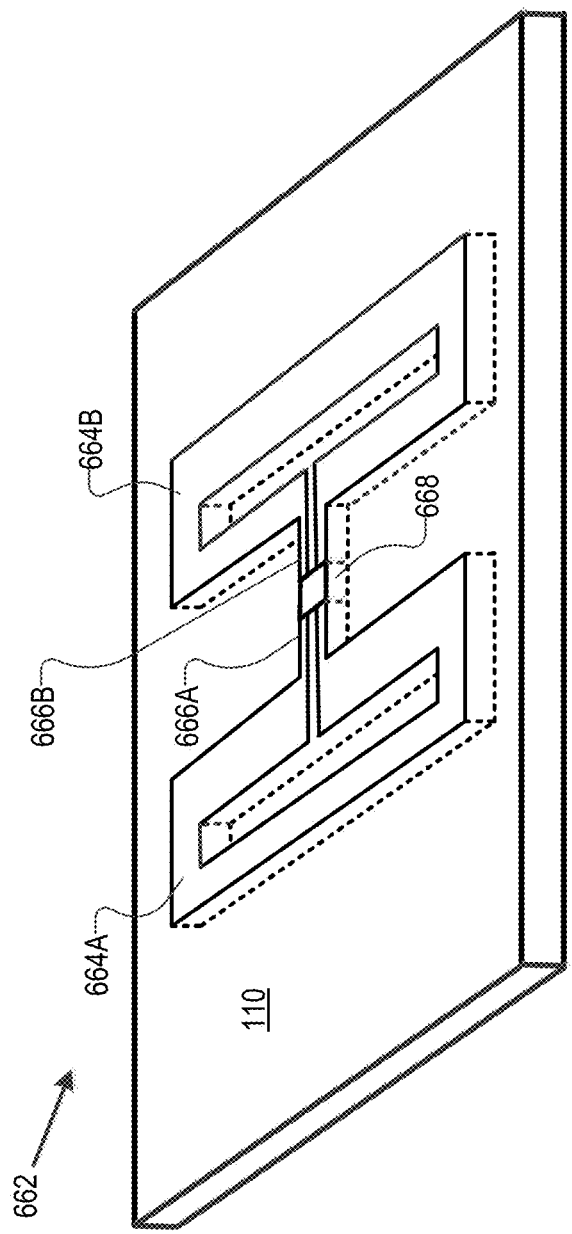
FIG. 6 depicts a three-quarters perspective view of first type of structure for absorbing IR in an infrared-absorbing area of the platform for use in conjunction with embodiments of the invention.

One embodiment of IR absorber 136 suitable for use in conjunction with embodiments of the invention is an antenna tuned to IR wavelengths. Such an embodiment is particularly useful for applications involving very long wave IR (>12 microns wavelength in air). FIG. 6 depicts directional half-wavelength dipole antenna 662, which is an example of an antenna suitable for service as an IR absorber.

Antenna 662 comprises two folded dipole antennas 664A and 664B that are connected via respective transmission lines 666A and 666B into resistive load element 668. The resistive load element matches the source resistance of antenna elements 664A and 664B. Antenna 662, having two folded dipoles antennas, is directional. The gain for different directions can be maximized by adjusting the relative lengths of the two transmission lines 666A and 666B.

It is notable that in the embodiment depicted in FIG. 6, antenna 662 is disposed within the device layer to provide an isothermal area surrounding the antenna. The antennas are formed by diffusing or ion implanting appropriate dopant atoms into device layer 110, in known fashion. The region surrounding the antenna (or antenna array) has a low dielectric loss coefficient at the IR band of interest. An alternative method of creating antenna 662 is to deposit a high electrical conductivity film including metal and then lithographically pattern it to form the desired resonant antenna structures.

Figure 7:
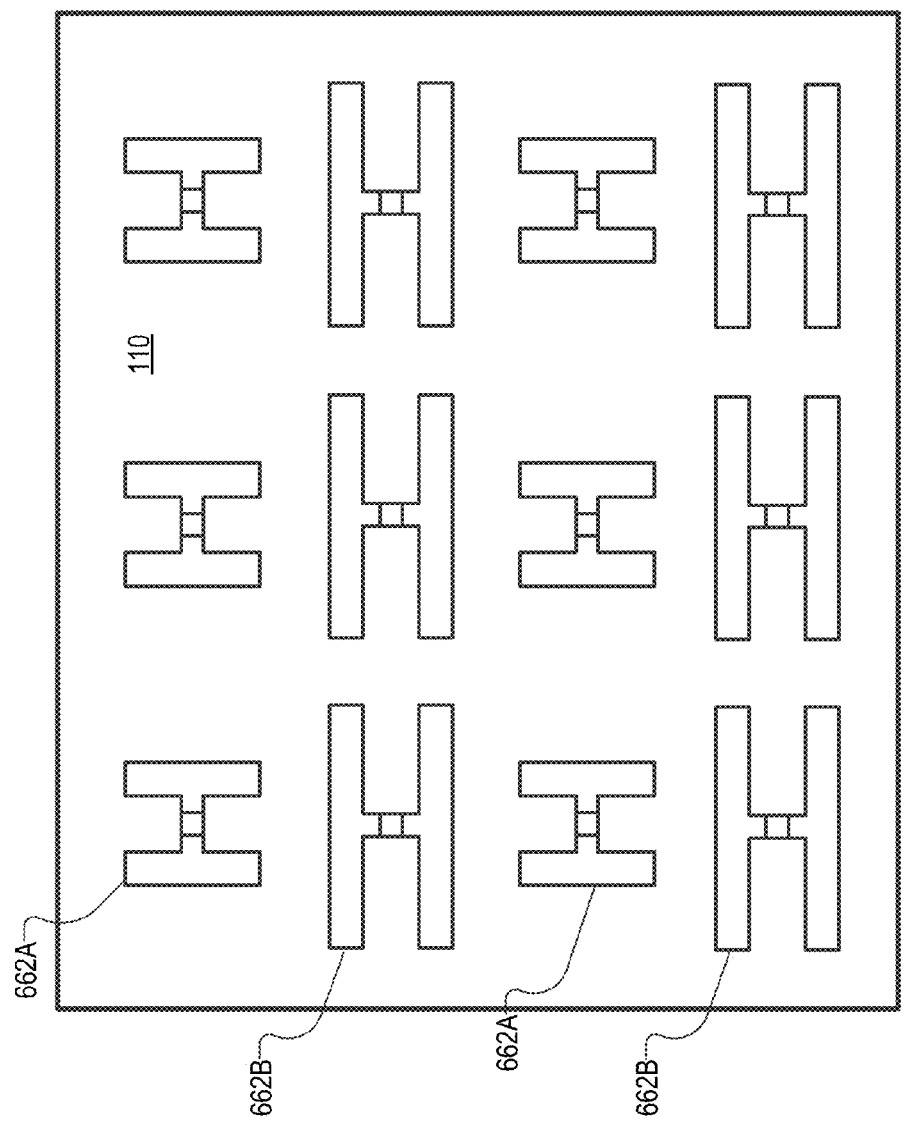
FIG. 7 depicts a plan view of an array of the first type of structures for absorbing IR, as shown in FIG. 6, for use in conjunction with embodiments of the invention.

FIG. 7 depicts a plan view of device layer 110 of a micro-platform, wherein the device layer includes an array of antennas, include two rows of directional half-wavelength dipole antennas 662A and two rows of directional half-wavelength dipole antennas 662B. Each antenna is resonant at one or more IR frequency bands. Antennas 662A are resonant at a different one or more IR frequency bands than antennas 662B. Also, antennas 662A and 662B are sensitive to different polarizations (i.e., vertical and transverse).

In some other embodiments, all antennas in the array are resonant at the same frequency band(s). In yet some further embodiments, at least some of the antennas in a given row of the array are resonant at IR frequency band(s) that are different from at least some other of the antennas in the same row. The antennas are diffused into, implanted into, or formed on device layer 110 in known fashion.

FIGS. 8A through 8D depicts additional embodiment of antennas suitable for use as IR absorbers in conjunction with embodiments of the invention. The antennas depicted in FIGS. 8A-8D can either overlie device layer 110 or be formed therein via diffusion/ion implantation.

Figure 8:
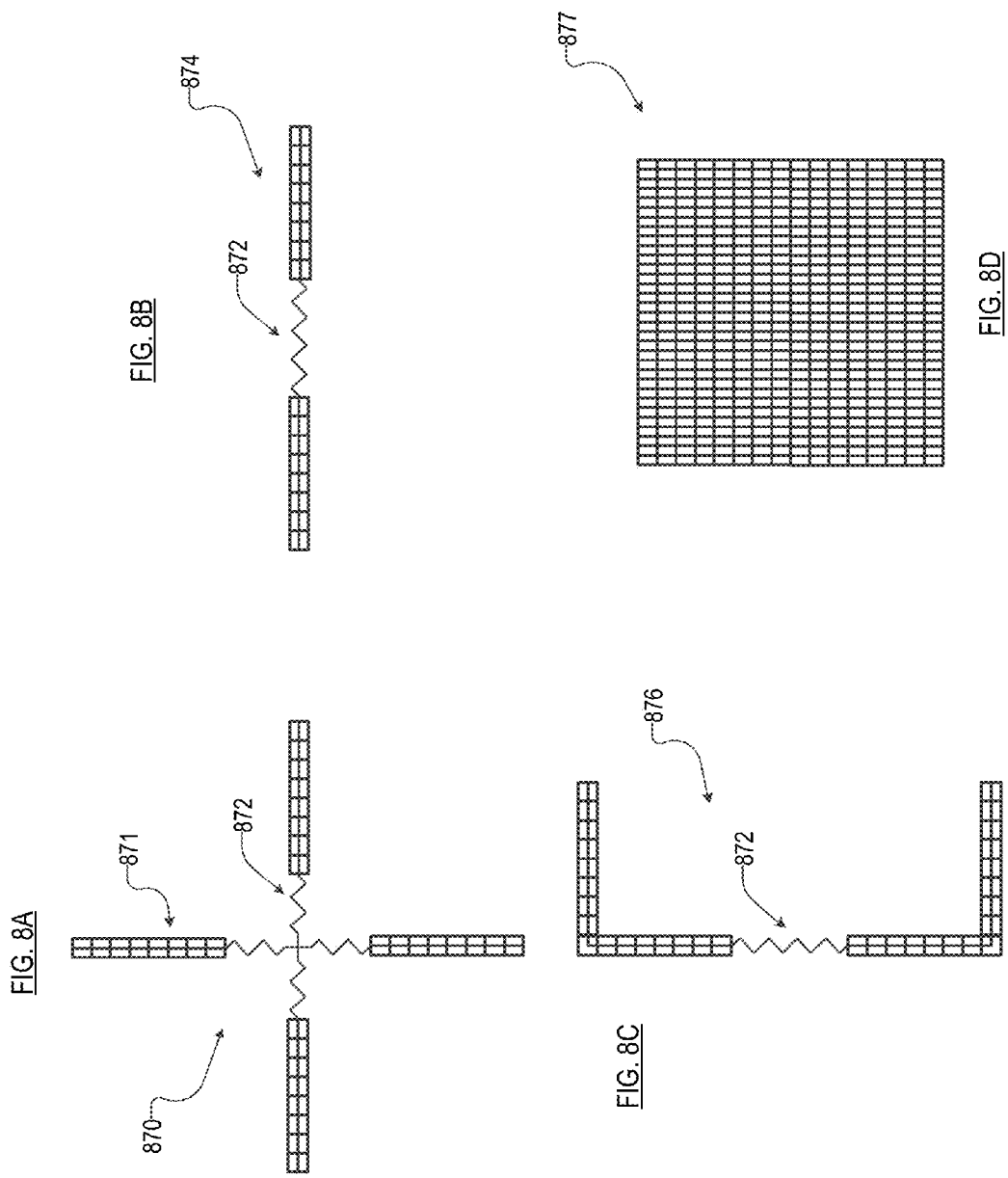
FIGS. 8A-8D depict further embodiments of the first type of structures for absorbing IR for use in conjunction with embodiments of the invention.

Antennas 870, 874, and 876 each include two or more antenna elements coupled by resistors 872. The resistor is a load element for dissipating heat (the received IR) into device layer 110. Antenna 870 of FIG. 8A is sensitive to transverse and vertical polarizations. Antenna 877 of FIG. 8D is a patch antenna. In some embodiments in which the IR absorber is a patch antenna, a dielectric material, such as $SiO_2$, is disposed above device layer 110, wherein the antenna is formed on dielectric material. As such, the antenna performs much like a patch antenna in more traditional UHF antenna structures.

In all embodiments (i.e., FIGS. 6, 7, and 8A-8D) cases, the antennas have nanometer-scale dimensions and, when formed in a surface such as device layer 110, will enhance the creation of surface plasmons. This provides local trapping of incident IR and, hence, causes further heating of device layer 110 to enhance detector response. Thus, the embedded nanoscale antennas used in conjunction with embodiments of the invention have different characteristics as compared to antenna behavior in free space.

Figure 9:
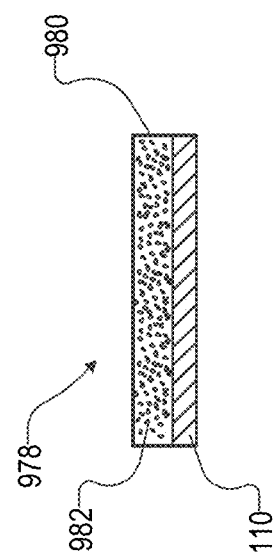
FIG. 9 depicts a cross-sectional view of a second type of structure for absorbing IR for use in conjunction with embodiments of the invention.

FIG. 9 depicts another embodiment of IR absorber 136 suitable for use in conjunction with embodiments of the invention: IR-absorbing film 978. The IR-absorbing film comprises dielectric film 980 with embedded nano-dimensioned particulates 982. Such a structure enhances IR absorption via plasmonic coupling.

Film 980 is a silicate matrix or other dielectric matrix. The film can be deposited on device layer 110 using a sol-gel process, generally referred to as "spin-on-glass" or "SoG" technology. Nano-dimensioned particulates 982, which have a largest dimension in a range of about 10 to 500 nanometers, comprise "coin" metals (e.g., Ni, Au, Ag, Cu, etc.).

Nano-dimensioned particulates 982 are in the form of nano-dimensioned discs, cubes, spheres, or literally any shape (including non-regular). Particulates 982 in film 980 can includes particulates of a single shape (e.g., all cubes, all spheres, etc.) or a variety of different shapes. The particulates provide a combination of absorption mechanisms, such as scattering with light trapping as plasmons. For coin-metal nano-dimensioned particulates 982 that touch device layer 110 (when silicon), another IR absorption mechanism exists. The particulates are formed into Schottky diodes with a eutectic rapid thermal anneal process. These Schottky diodes extract energy from the surface plasmons and also directly via a classical electromagnetic "radar cross section," thereby dissipating energy into the micro-platform, as desired.

Figure 10:
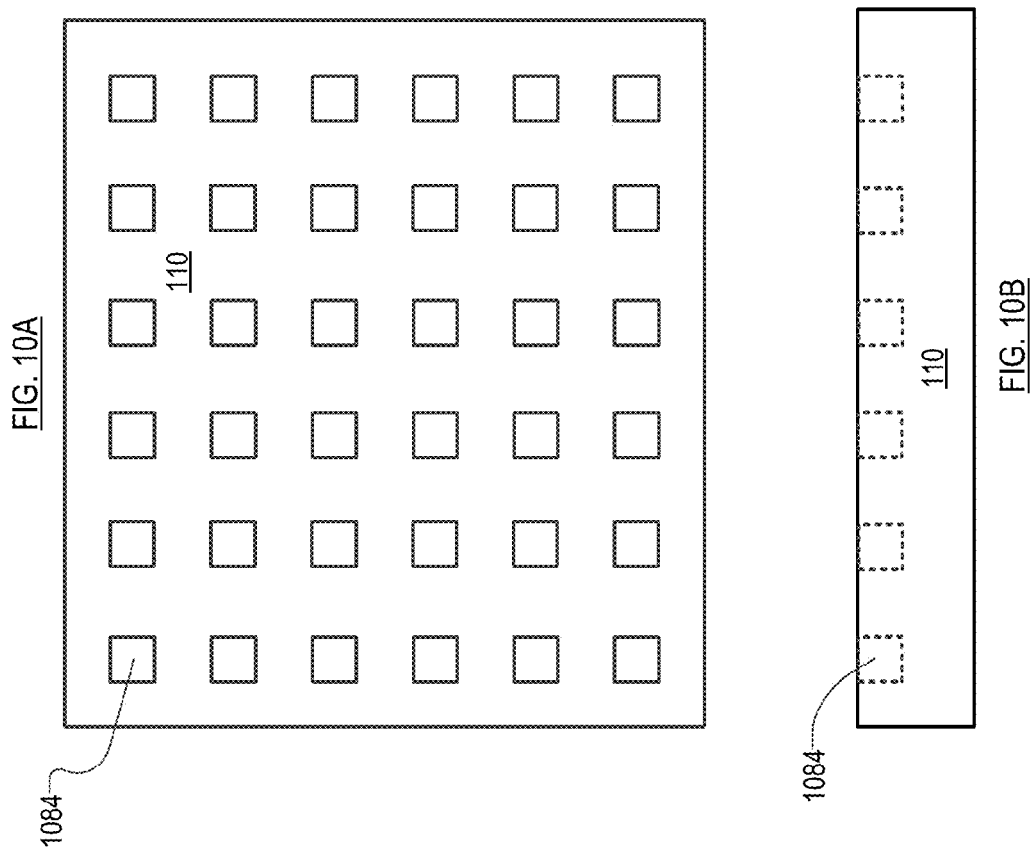
FIGS. 10A and 10B depict respect plan and cross-sectional views of a third type of structure for absorbing IR for use in conjunction with embodiments of the invention.

FIGS. 10A and 10B depict, via respective plan and cross-sectional views, another embodiment of IR absorber 136. In these Figures, the IR absorber comprises a high-density (i.e., nanometer spacing between adjacent cavities) of nano-dimensioned cavities 1084 in device layer 110. The cavities enhance absorption of IR incident on device layer 110, particular for mid- to long-wavelength IR.

Figure 11:
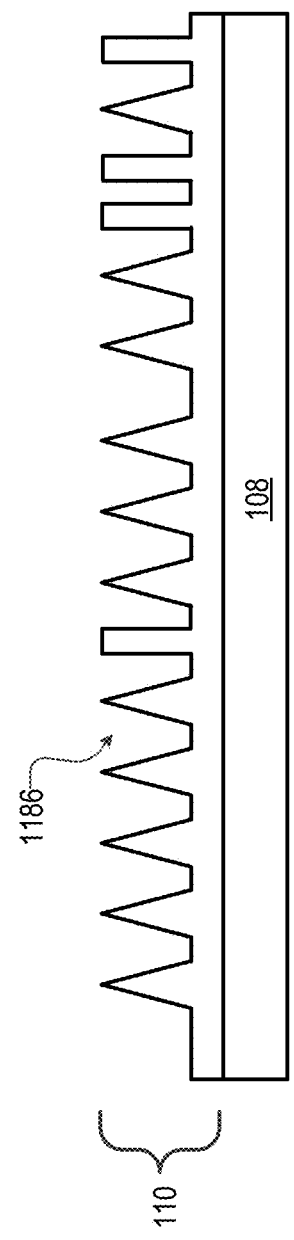
FIG. 11 depicts a side view of a fourth type of structure for absorbing IR for use in conjunction with embodiments of the invention.

FIG. 11 depicts yet a further embodiment of IR absorber 136. In the embodiment depicted in FIG. 11, IR absorber 136 comprises a high density of "grass" or "blades" 1186 or pedestals (i.e., nanometer spacing between adjacent "blades" or pedestals). Like cavities 1084, the grass and pedestals are nano-dimensioned and enhance absorption of mid- to long-wave IR incident on device layer 110. Grass 1186 is not necessarily uniform in structure, as represented by the "triangular" and "rectangular" forms depicted in FIG. 11. The presence of grass 1186 greatly increases the absorption efficiency of IR, as opposed to an un-patterned layer of the same material. In some embodiments, the "height" of grass 1186 is at least one-quarter wavelength of the incident IR. Since the shortest wavelength IR is about 700 nanometers, that equates to a minimum height of about 175 nanometers. Typical width/diameter of the grass is in the range of about 1-10 nanometers for a minimum L/D greater than 15.

Various processes can be used to form cavities 1084, grass 1186, and pedestals on or in device layer 110, particularly when the layer comprises single crystal silicon. For example, and without limitation, to form cavities 1084, deep sub-micron lithography can be used to create a two dimensional array of such cavities. Grass 1186 and pedestals can be formed, for example, using DRIE (deep reactive ion etching). The term "silicon grass," as used in this disclosure and the appended claims, means the grass/blade-like structure referenced, as formed in silicon.

Furthermore, grass or pedestals can be formed by growing vertical multiwall carbon nanotubes ("VMWCNTs") on micro-platform 104. This can be accomplished, for example, by a first atomic layer deposition, which serves as a catalyst for growth. This deposition is followed by chemical vapor deposition ("CVD") process with an acetylene precursor to grow the VMWCNTs. The L/D for the VMWCNTs will be much greater than 15.

In some embodiments, cavities 1084, and/or grass 1186, and/or pedestals are used as the sole IR absorber(s). In some other embodiments, one or more of these structures are present on/in device region 110 in conjunction with other IR absorbers, such as the antenna structures or IR-absorbing film.

In addition to arrays 120 and 126 of thermocouples 112 and IR absorbers 136, the illustrative embodiment (but not all embodiments) of IR sensor 100 includes resistor 132 and piezo transducer 134 (see FIG. 1). These elements provide several functions, as explained below.

As previously noted, in some embodiments, IR sensor 100 is sealed via a header and maintained under vacuum or under pressure using a low-thermal conductivity gas such as xenon, argon, krypton, etc. The reason for this is to limit the thermal paths for cooling of nanowires 214 of the thermocouples. Heat conduction through the gas or radiation decreases the sensitivity of the infrared sensor. It is therefore important to maintain vacuum or elevated pressure, and, as described further below, one function of resistor 132 and piezo-transducer 134 is to detect hermetic seal failures or incremental gas leaks.

Also, as previously disclosed, IR sensor 100 includes thermocouples operating as Peltier coolers to cool device layer 110. This is advantageous because cooling reduces the electrical thermal noise inherent in the output signal from the sensing thermocouples. To monitor the temperature of device layer 110, and to provide a signal for closed-loop control of the temperature of the device layer, resistor 132 is used.

Furthermore, accurate pressure measurement via the piezo-transducer requires a correction for absolute temperature. Resistor 132 provides that functionality as well.

Figure 12:
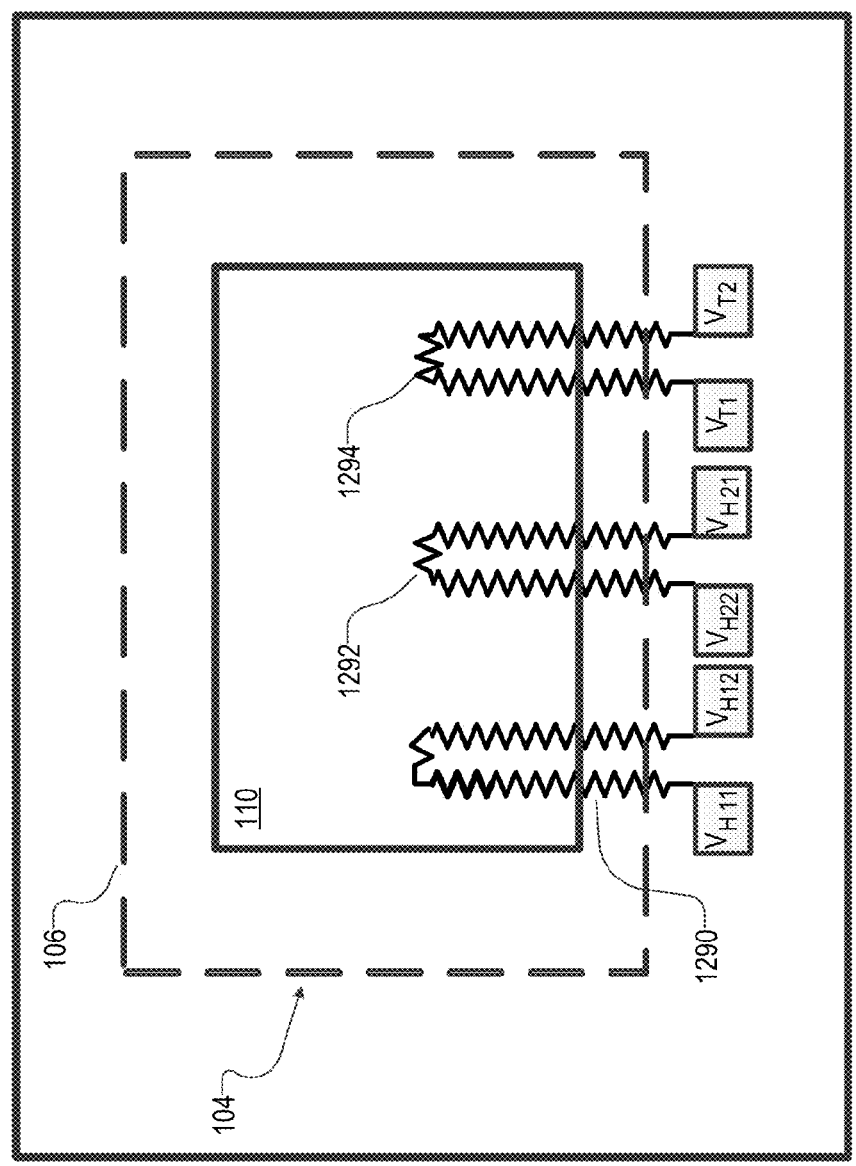
FIG. 12 depicts, via a plan view, elements for determining the mechanical oscillation frequency of the platform of the IR sensor of FIG. 1.

FIG. 12 depicts elements that can be used for pressure sensing/monitoring and temperature calibration thereof. These elements include ohmic heater 1290, piezo-resistor 1292, and thermistor 1294. These elements are functionally equivalent to resistor 132 and piezo-transducer 134 depicted in FIG. 1. Specifically, piezo-resistor 1292 and thermistor 1294 are equivalent to resistor 132 and ohmic heater 1290 is equivalent to piezo-transducer 134.

Micro-platform 104 will stress slightly up or down as a function of pressure conditions within hermetically sealed IR sensor 100. It will be appreciated that the self-resonant frequency of micro-platform is a function of that pressure. Heater 1290 (or piezo-transducer 134) is driven by an external voltage pulse applied to the electrical contacts thereof. As a result of the pulsed heating of micro-platform 104 and the different thermal coefficient of expansion of support layer 108 and device layer 110, the micro-platform experiences a pulsed flexing. The flexing excites a mechanical oscillation mode of the micro-platform, thereby causing the platform to resonate. In the embodiment depicted in FIG. 12, piezo-resistor 1290 is used to sense the resonant frequency. It does so by generating a voltage as a consequence of movement of the platform, wherein that voltage is a function of the frequency of the movement.

In the illustrative embodiment wherein device layer 110 is single crystal silicon, heater 1290 (piezo-transducer 134) can also be used as a piezo-resistor to determine the resonant frequency. In some embodiments, the micro-platform is excited into a self-resonant mode by mechanical impulses from an integral piezoelectric actuator. The frequency of this oscillation is sensed by an integral piezo-resistive transducer. In embodiments in which single crystal silicon is used for device layer 110 and silicon dioxide is used for support layer 108, the piezoelectric and the piezo-resistive transducers diaphragms may be one and the same.

A look-up table (stored in processor-accessible memory) is used to determine the gas pressure based on the resonant frequency. Thermister 1294 (resistor 132) or other temperature-sensing structures are used to determine platform temperature or calibrate the pressure sensor function.

The wires composing resistor 132 and piezo-transducer 134, which are on or within micro-platform 104, can be, but are not necessarily, nanowires.

Figure 13:
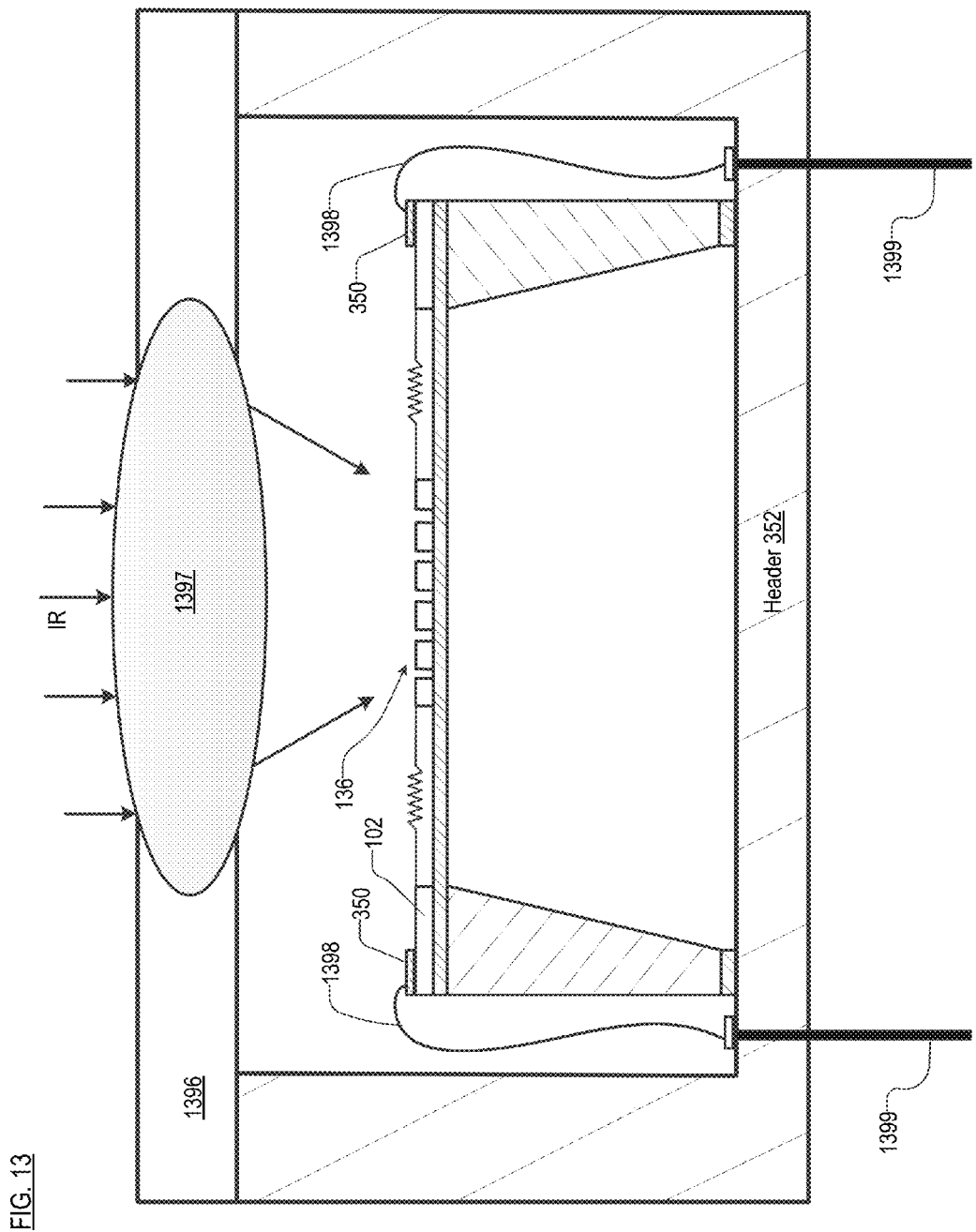
FIG. 13 depicts a cross-sectional view of the IR sensor of FIG. 1 packaged in accordance with an embodiment of the invention.

FIG. 13 depicts the packaged IR sensor 100. Cap 1396 includes an IR-transparent lens 1397 to direct incoming IR to IR absorbers 136 of the micro-platform. Interconnects 1398 couple electrical contacts 350 on off-platform region 102 to electrical contacts on header 352. Leads 1399 couple the signals from interconnects 1398 to external processing (not depicted). It will be appreciated that more interconnects than are depicted in FIG. 13 are typically present for conducting a variety of different signals (pressure sensing, absolute temperature, signals from sense thermocouples 120, etc.) to external processing.

In summary, embodiments of IR sensor 100 in accordance with the present teachings include one or more of the following features:

- One or more cavities formed in a substrate, the cavities defining a corresponding number of micro-platforms. This arrangement serves, among any other functions, to thermally isolate each micro-platform from all off-platform regions.
- Each micro-platform includes one or more arrays of semiconductor thermoelectric devices operated in a Seebeck thermovoltaic mode, wherein the thermoelectric devices generate a voltage responsive to a temperature change due to absorbed IR.
- Each micro-platform includes one or more arrays of semiconductor thermoelectric devices that are arranged and operated as Peltier coolers with externally supplied power to cool the device layer.
- Each array of thermoelectric devices is structurally programmed, via circuit interconnects, to provide a desired electrical resistance and thermoelectric response.
- Each on-platform junction is connected via nanowires to another junction positioned off-platform.
- A thermistor or other semiconductor device located either on the substrate or integral to the micro-platform for providing absolute temperature in order to calibrate the gauge factor of the IR sensor response and provide closed-loop control of temperature.
- The nano-wires of the thermoelectric devices comprise phonon scattering structures.
- Thermoelectric devices and other elements on or in the device layer are closely-spaced to provide a substantially isothermal platform.
- In some embodiments, there is no ohmic-metal interconnect between the doped semiconductor regions, and the couple is heavily doped on both sides providing a form of p-n junction.
- One or more structures for enhancing absorption of IR.
- Structures for exciting and monitoring resonance of the micro-platform, which is sensitive to the level of vacuum or pressure. The structure will thermally excite or piezo-excite and piezo-sense a self-resonant frequency of the micro-platform to determine gas pressure. In such embodiments, the cavity beneath the micro-platform is advantageously, but not necessarily, hermetically sealed.
- The header and micro-platform(s) are hermetically sealed and exposed to a low-thermal conductivity gas such as, without limitation, air, argon, xenon, or krypton.
- An ohmic resistive heater with externally supplied electric power.
- The thermoelectric devices and nano-wires are formed from a device layer, wherein the layer is selected from the following non-exclusive list of materials, including Si, Ge, SiGe, BiTe, graphine, carbon nanotubes.
- The micro-platform comprises a support layer having low thermal conductivity, wherein the support layer is selected from the following non-exclusive list of materials including $SiO_2$, $Si_3N_4$ and $TiO_2$.
- A preamplifier circuit to amplify the signal from the thermoelectric devices that are operated as sensors.
- The packaging includes an infrared-transparent window or lens, wherein the window or lens is selected from the following non-exclusive list of materials including: Si, Ge, NaCl, KBr, ZnSe.
- Discrete dipole antennas with in-situ load elements to increase IR absorption within selected wavelength bands.
- IR sensors implemented as spatially-differentiated or wavelength-differentiated pixels.

It is to be understood that although the disclosure teaches many examples of embodiments in accordance with the present teachings, many additional variations of the invention can easily be devised by those skilled in the art after reading this disclosure. As a consequence, the scope of the present invention is to be determined by the following claims.

What is claimed:

1. An IR sensor comprising:
   a micro-platform, the micro-platform having a support layer that is suspended at a perimeter thereof, and a device layer disposed on a portion of the support layer;
   an off-platform region, the off-platform region surrounding the micro-platform;
   one or more IR absorbers disposed in or on the device layer;
   a plurality of thermoelectric devices, wherein a first junction of each thermoelectric device is disposed in or on the device layer and a second junction of each thermoelectric device is disposed in or on the off-platform region; and
   a plurality of nano-wires, wherein the nanowires electrically couple the first junction to the second junction, and further wherein the nano-wires comprise scattering holes physically adapted to scatter phonons.

2. The IR sensor of claim 1 wherein the IR sensor is maintained under vacuum or gas pressure, and wherein the IR sensor further comprises a pressure-sensing arrangement that detects loss of vacuum or an incremental gas leak.

3. The IR sensor of claim 1 wherein the plurality of thermoelectric devices are series-connected to one another.

4. The IR sensor of claim 1 wherein:
   (a) the plurality of thermoelectric devices are organized into a first group and a second group;
   (b) the thermoelectric devices in the first group are series-connected to one another but not to the thermoelectric devices in the second group; and
   (c) the thermoelectric devices in the second group are series-connected to one another but not to the thermoelectric devices in the first group.

5. The IR sensor of claim 4 wherein the first group of thermoelectric devices is operated in a Seebeck thermovoltaic mode wherein a voltage is generated responsive to heating of the first junction of each thermoelectric device in the first group.

6. The IR sensor of claim 4 wherein the second group of thermoelectric devices is operated in a Peltier cooling mode wherein the first junction of each thermoelectric device in the second group cools responsive to the application of a voltage to the second group of thermoelectric devices.

7. The IR sensor of claim 1 wherein the IR absorbers comprise a plurality of antennas having nano-scale dimensions.

8. The IR sensor of claim 7 wherein the antennas are formed in the device layer.

9. The IR sensor of claim 7 wherein at least some of the antennas comprise two folded dipole antenna elements.

10. The IR sensor of claim 7 wherein at least some of the antennas comprise a load element, wherein the load element dissipates heat to the device layer.

11. The IR sensor of claim 7 wherein at least some of the antennas are sensitive to more than one polarization of incoming IR.

12. The IR sensor of claim 7 wherein all the antennas are resonant at the same frequency bands.

13. The IR sensor of claim 7 wherein some of the antennas are resonant at different frequency bands than other of the antennas.

14. The IR sensor of claim 1 wherein the IR absorbers comprise an IR-absorbing film, wherein the IR-absorbing file comprises a dielectric film have particulates embedded therein.

15. The IR sensor of claim 14 wherein the particulates are nano-sized.

16. The IR sensor of claim 14 wherein the particulates comprise coin metals.

17. The IR sensor of claim 1 wherein the IR absorbers comprise a plurality of cavities in the device layer, wherein the cavities are nano-dimensioned and spacing between cavities is nano-sized.

18. The IR sensor of claim 1 wherein the IR absorbers comprise a plurality of blade-like structures having a length-to-diameter ratio of at least 15.

19. The IR sensor of claim 1 wherein the IR absorbers comprise silicon grass.

20. The IR sensor of claim 7 wherein the IR absorbers further comprise silicon grass.

21. An IR sensor comprising:
 a micro-platform, the micro-platform having a support layer that is suspended at a perimeter thereof, and a device layer disposed on a portion of the support layer;
 an off-platform region, the off-platform region surrounding the micro-platform;
 one or more IR absorbers disposed in or on the device layer;
 a first plurality of series-connected thermoelectric devices that generate a voltage in response to heating of the device layer due to received IR, wherein a first portion of each voltage-generating thermoelectric device is disposed in or on the device layer and a second portion is disposed in or on the off-platform region;
 a second plurality of series-connected thermoelectric devices that cool the device layer, wherein a first portion of each cooling thermoelectric device is disposed in or on the device layer and a second portion is disposed in or on the off-platform region;
 a first plurality of nano-wires that electrically couple the first portion of voltage-generating thermoelectric devices to the second portion thereof; and
 a second plurality of nano-wires that electrically couple the first portion of the cooling thermoelectric devices to the second portion thereof, wherein the nano-wires in both the first plurality and the second plurality comprise scattering holes physically adapted to scatter phonons.

22. The IR sensor of claim 21 wherein the support layer comprises silicon dioxide and the device layer comprises single-crystal silicon.

23. The IR sensor of claim 21 is maintained under vacuum or gas pressure, and wherein the IR sensor further comprises a resistor and a piezo-transducer physically arranged on the micro-platform to detect loss of vacuum or an incremental gas leak.

24. The IR sensor of claim 21 wherein the IR absorbers comprise one or more structures selected from the group consisting of one or more antennas having nano-scale dimensions, an IR-absorbing film, a plurality of cavities having nano-scale dimensions, and silicon grass.

25. An IR sensor comprising:
 a micro-platform, the micro-platform having a support layer comprising silicon dioxide that is suspended at a perimeter thereof, and a device layer comprising single-crystal silicon disposed on a portion of the support layer;
 an off-platform region, the off-platform region surrounding the micro-platform;
 one or more IR absorbers disposed in or on the device layer;
 a first plurality of series-connected junctions disposed in or on the device layer, wherein the first plurality of junctions are electrically coupled to a second plurality of series-connected junctions disposed in or on the off-platform region via a plurality of nano-wires that are physically adapted to scatter phonons;
 a third plurality of series-connected junctions disposed in or on the device layer, wherein the third plurality of junctions are electrically coupled to a fourth plurality of series connected junctions disposed in or on the off-platform region via a plurality of nano-wires that are physically adapted to scatter phonons; and
 a heater, driven by a voltage pulse, that heats the micro-platform and drives it to resonance;
and a device for measuring absolute temperature of the micro-platform.

26. The IR sensor of claim 25 wherein the IR absorbers comprise one or more structures selected from the group consisting of one or more antennas having nano-scale dimensions, an IR-absorbing film, a plurality of cavities having nano-sized dimensions, and silicon grass.

* * * * *